United States Patent
Won

(10) Patent No.: US 8,446,795 B2
(45) Date of Patent: May 21, 2013

(54) DEVICE AND METHOD FOR PROTECTING DATA IN NON-VOLATILE MEMORY

(75) Inventor: Youjip Won, Seongnam-si (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 206 days.

(21) Appl. No.: 13/057,034

(22) PCT Filed: Jul. 31, 2009

(86) PCT No.: PCT/KR2009/004304
§ 371 (c)(1),
(2), (4) Date: Feb. 1, 2011

(87) PCT Pub. No.: WO2010/013979
PCT Pub. Date: Feb. 4, 2010

(65) Prior Publication Data
US 2011/0141839 A1    Jun. 16, 2011

(30) Foreign Application Priority Data
Aug. 1, 2008  (KR) .......................... 10-2008-0075519

(51) Int. Cl.
*G11C 5/14*    (2006.01)

(52) U.S. Cl.
USPC ................. 365/228; 365/185.04; 365/185.23; 365/189.17; 365/194

(58) Field of Classification Search
USPC ................. 365/228, 185.04, 185.23, 189.17, 365/194
See application file for complete search history.

(56) References Cited

U.S. PATENT DOCUMENTS

| | | | |
|---|---|---|---|
| 5,491,794 A * | 2/1996 | Wu | .................................. 714/23 |
| 6,105,140 A | 8/2000 | Crisan | |
| 2003/0189860 A1 | 10/2003 | Takeuchi et al. | |
| 2010/0008175 A1* | 1/2010 | Sweere et al. | ................. 365/229 |

FOREIGN PATENT DOCUMENTS

JP    2003-338889    11/2003

OTHER PUBLICATIONS

International Search Report for PCT/KR2009/004304, mailed Sep. 28, 2009.

* cited by examiner

*Primary Examiner* — Fernando Hidalgo
(74) *Attorney, Agent, or Firm* — Nixon & Vanderhye PC

(57) ABSTRACT

Disclosed is a non-volatile memory data protecting device and method. The non-volatile memory data protecting device (200) that is used for protecting non-volatile memory data when a power is shut down in a system, may include a signal delay unit (230) to delay a drop in voltage of an input/output line, a power shutdown sensor (210) to sense power shutdown of a system, and a controller (220) to control the signal delay unit in response to whether the system is shut down.

13 Claims, 2 Drawing Sheets

DEVICE AND METHOD FOR PROTECTING DATA IN NON-VOLATILE MEMORY

This application is the U.S. national phase of International Application No. PCT/KR2009/004304, filed 31 Jul. 2009, which designated the U.S. and claims priority to KR Application No. 10-2008-0075519, filed 1 Aug. 2008, the entire contents of each of which are hereby incorporated by reference.

TECHNICAL FIELD

The present invention relates to a non-volatile memory data protecting device and method, and particularly, to a device and method of delaying a drop in voltage of an input/output line for a predetermined time when a power is shut down, such as a system shutdown, thereby protecting data in a non-volatile memory.

BACKGROUND ART

A non-volatile memory, such as a ferroelectric Random Access Memory (FRAM), a magnetoresistive Random Access Memory (MRAM), a phase-change Random Access Memory (PRAM), and the like, may access in a byte unit and may simultaneously maintain contents without a power supply. The non-volatile memory has been the focus of attention as a next generation device being capable of efficiently compensating a weak point of a conventional Flash memory, and a dynamic Random Access Memory (DRAM) device.

However, although the DRAM device and an SRAM device may temporarily store unintentional data when a power is abnormally shut down, a volatile device such as the DRAM may not be able to maintain the data without the power supply, and thus, the temporarily stored data may be destructed when the power is cut off. The flash memory device stores data based on a block unit, and the power of the flash memory device may be maintained at an threshold voltage level for an appropriate time to store the data. When the power is abnormally shut down, a time where the power is maintained at the threshold voltage level is insufficient to store the data in the flash memory device.

However, the non-volatile memory may store the data during a short time where the power is maintained at the threshold voltage level. In this instance, all signals transmitted to a memory device are regarded as normal signals.

When the power is shut down in a system, the power supplied to a non-volatile memory chip slowly decreases due to an effect of a capacitor from a time when the power is shut down. That is, although the power is cut off, a device is operational until a voltage is less than or equal to a threshold voltage. Conversely, when the system is shut down, a memory controller may decrease voltages of all signal lines including a chip selection signal, a write enable signal, and the like, to 0V, and thus, data may be inadvertently written in an address number 0 of all memory addresses. so as not to destroy data of the non-volatile memory when the power is shut down in the system.

DISCLOSURE OF INVENTION

Technical Problem

An aspect of the present invention provides a non-volatile memory data protecting device and method that may determine whether a power is shut down in a system, and may delay a drop in voltage of an input/output line, thereby protecting data of the non-volatile memory from destruction even when the power is shut down.

Another aspect of the present invention also provides a non-volatile memory data protecting device and method that may control a delay circuit, which delays a drop in voltage, to operate only when a power is shut down in a system, thereby preventing a degradation of system performance and a malfunction of the system.

Solution to Problem

According to an aspect of the present invention, there is provided a non-volatile memory data protecting device, the device including a signal delay unit to delay a drop in voltage of an input/output line, a power shutdown sensor to sense power shutdown of a system, and a controller to control the signal delay unit in response to whether the system is shut down.

In this instance, the signal delay unit includes at least one of a capacitor, a buffer, and a delay circuit to delay a drop in voltage of the input/output line for a predetermined time, and the predetermined time is a period where a voltage supplied to the non-volatile memory is changed to be less than or equal to a threshold voltage.

Also, the power shutdown sensor senses power shutdown by using a digital signal that is generated when the power is shut down.

Also, the digital signal includes at least one of a clock enable (CKE) and a power down exit mode.

According to another aspect of the present invention, there is provided a non-volatile memory data protecting method, the method including sensing power shutdown of a system, and delaying a drop in voltage of an input/output line in response to the power shutdown of the system.

Also, the sensing of the power shutdown of the system senses the power shutdown by using a digital signal that is generated when the power is shut down.

Also, the delaying of the drop in voltage includes delaying the drop in voltage for a predetermined time when the system is shut down by using at least one of a delay circuit, a buffer, and a capacitor, and preventing the delay of the drop in voltage when the system is not shut down.

MODE FOR THE INVENTION

Figure 1:
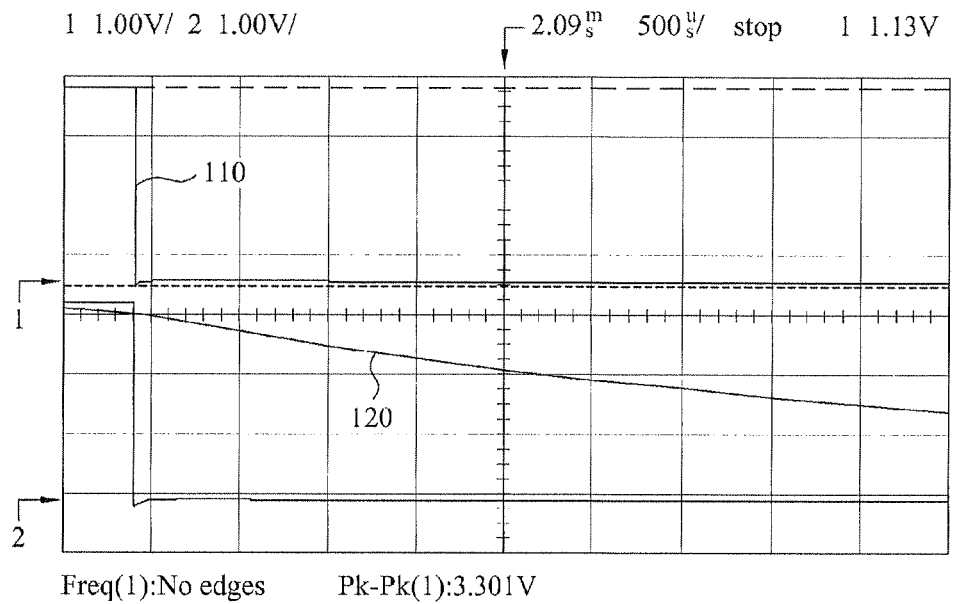
FIG. 1 is a diagram illustrating a memory input signal and a system voltage in a conventional system, when a power of the system is shut down.

Reference will now be made in detail to embodiments of the present invention, examples of which are illustrated in the accompanying drawings, wherein like reference numerals refer to the like elements throughout. The embodiments are described below in order to explain the present invention by referring to the figures.

In general, when a non-volatile memory having a same configuration as a general memory is used, a board containing a non-volatile memory chip may have a data line, an address line, and a command line and thereby may perform input/output. In this instance, the address line indicates an address where input/output is performed. Also, the data line is a route through which data to be read or written is transmitted, and the command line is a channel through which a command to be actually executed is transmitted. Here, a chip selection signal or a chip enable signal that indicates a chip to which the command is transmitted and a write enable signal that indicates a write operation may be transmitted through the command line.

FIG. 1 is a diagram illustrating a memory input signal and a system voltage in a conventional system, when a power of the system is shut down.

Referring to FIG. 1, a graph 120 represents that a voltage of the power of the system decreases when the system is shut down. When the power of the system is shut down, a voltage supplied to a non-volatile memory chip slowly decreases due to a capacitor from a time when the power is shut down. That is, although the power is cut off, a device may operate until the voltage is less than or equal to a predetermined voltage. Conversely, a graph 110 represents that a memory input signal rapidly decreases immediately after the system is shut down. That is, when the system is shut down, a memory controller may decrease, instantly, voltages of all the signal lines including a chip selection signal, a write enable signal, and the like, to 0V. Here, when the chip selection signal is decreased to 0V, an address number 0 is selected, and when the write enable signal is decreased to 0V, data may be written in an address number 0 of all memory addresses.

Accordingly, when the system is shut down, existing contents may be destroyed and the destroyed data may be permanently stored. Sometimes, destruction of contents stored in a corresponding location may cause a fateful consequence such as a loss of legal/medical record, a system operation error, and the like. Accordingly, there may need for a non-volatile memory data protecting device and method that delays a drop in voltage of a memory input/output line for a predetermined time to prevent existing data from destruction by a new data that is randomly stored in an unintentional location when the system is shut down. Hereinafter, a non-volatile memory data protecting device and method will be described in detail.

Figure 2:
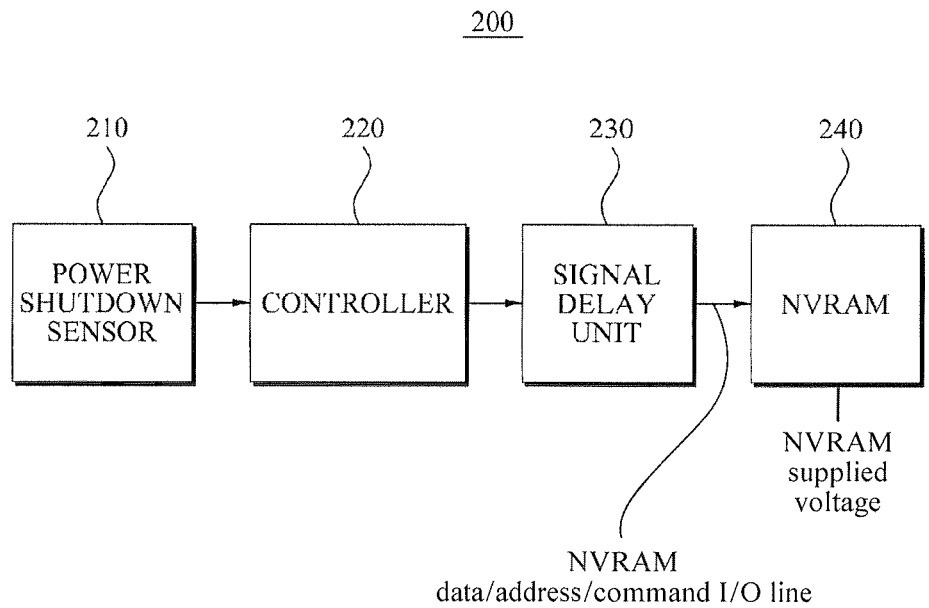
FIG. 2 is a diagram illustrating a non-volatile memory data protecting device according to an embodiment of the present invention.

FIG. 2 is a diagram illustrating a non-volatile memory data protecting device according to an embodiment of the present invention.

Referring to FIG. 2, the non-volatile memory data protecting device 200 may include a power shutdown sensor 210, a controller 220, and a signal delay unit 230.

The power shutdown sensor 210 may sense a power shutdown of a system. That is, the power shutdown sensor may monitor the power shutdown of the system, such as a system shutdown, and the like, thereby enabling the non-volatile memory data protecting device 200 to cope with difficulties occurring when the power shutdown occurs in the system.

In this instance, the power shutdown sensor 210 may sense the power shutdown by using a digital signal generated when the power is shut down. Here, the digital signal may include one of a clock enable (CKE) and a power down exit mode. Hereinafter, an example of delaying a signal transfer time by using the power down exit mode will be described in detail with reference to FIG. 4.

Figure 4:
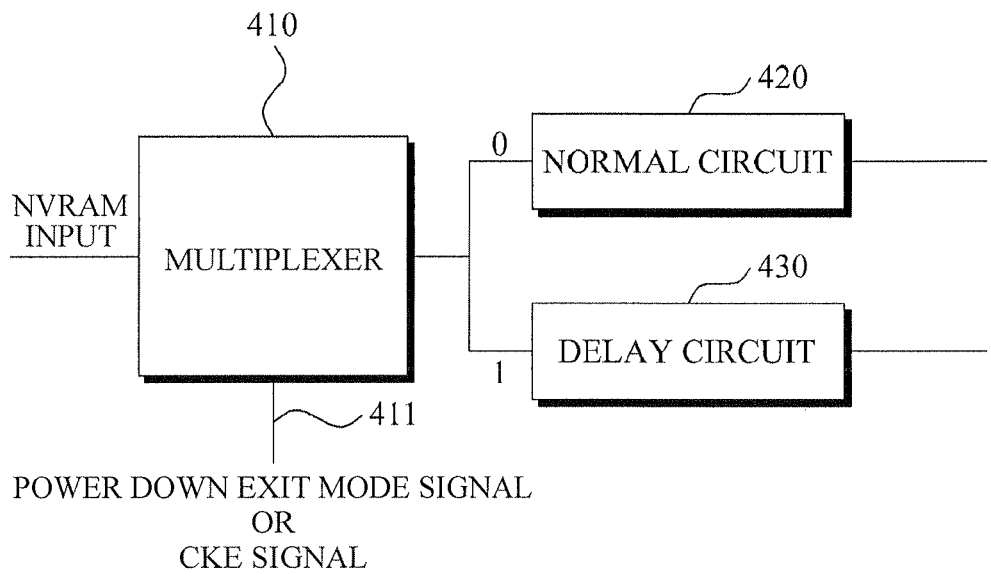
FIG. 4 is a diagram illustrating a delaying of a signal transfer time by using a power down exit mode according to an embodiment of the present invention.

FIG. 4 is a diagram illustrating a delaying of a signal transfer time by using a power down exit mode according to an embodiment of the present invention.

Referring to FIG. 4, a multiplexer 410 may be used to control a signal transfer route, the multiplexer 410 utilizing the power down exit mode as a selection input 411. In this instance, when the power down exit mode is selected through the selection input 411, a signal may be allowed to detour to a delay circuit 430. That is, a wrong input may be prevented from being inputted to a memory based on a circuit that may determine the signal to pass through either a normal circuit 420 or the delayed circuit 430 according to a status of the power down exit mode.

Referring again to FIG. 2, the signal delay unit 230 may delay a drop in voltage of an input/output line. That is, when the power shutdown sensor 210 senses the power shutdown, the signal delay unit 230 may delay a point in time where a memory controller decreases voltages of all input/output lines including a command line, an address line, a data line, and the like. In this instance, the delayed time may be set to a time where a voltage supplied to the non-volatile memory 240 is less than or equal to a threshold voltage. Here, the voltage supplied to the non-volatile memory 240 may slowly decrease due to an effect of a capacitor and may operate until the voltage is decreased to be less than or equal to the threshold voltage, and thus, the signal delay unit 230 may delay a time to enable the voltages of all the lines, such as the command line, the address line, the data line, and the like, to slowly decrease. That is, when the voltages of the all lines such as the command line, the address line, the data line, and the like, rapidly decreases, a chip selection signal is decreased to 0V, and thus, an address number 0 may be selected. Also, a write enable signal decreases to 0V, and thus a write is enabled. Also, unintentional data may be stored in an address number 0 of all memory addresses, and thus, existing data may be destroyed. Accordingly, the non-volatile memory data protecting device 200 may contain the signal delay unit 230 to slowly delay voltages of all lines including the command line, the address line, the data line, and the like, thereby delaying the drop in voltage for a predetermined time.

In this instance, at least one of a delay circuit, a buffer, and a capacitor may be used to delay the signal transfer time.

Here, the delay circuit or the buffer, which is a nonlinear transfer circuit, may be embodied by using a mono-stable multi-vibrator, a shift register, and the like. In this instance, a value inputted to one side of the shift register is shifted by one bit in an opposite direction at each clock. After a predetermined number of clocks, the inputted value may move to an opposite bit and may appear in an outputting unit. That is, the shift register may be used for delaying a signal for a predetermined number of clocks.

Also, when the selection input 411 is in the power exit mode, a CPU or a controller may generate the write enable signal or the chip selection signal after the predetermined number of clocks, to delay the signal transfer time.

The controller 220 may control the signal delay unit in response to whether the power is shut down in the system. That is, when the power is shut down in the system, the controller may control the signal delay unit to operate and when the power is not shut down in the system, the controller may control the signal delay unit to not operate. That is, when the delay circuit, the buffer, and the like are added to the command line, the address line, and the data line, generation of a corresponding signal is delayed even in a general operation environment, and thereby may cause a malfunction of the system or a degradation of system performance. Accordingly, the controller 220 may control the signal delay unit to operate only when the power shutdown sensor 210 senses that the power is shut down, to delay the generation or transfer of the corresponding signal only when the power is shut down such as a system shutdown.

As described above, when the power is shut down, the memory controller may immediately decrease the voltages of all signal lines to 0V, and thus, the delay circuit and the like are contained in the command line, the address line, and the data line to prevent destruction of the non-volatile memory data, unlike a voltage of non-volatile memory module that slowly decreases due to an effect of the capacitor.

Also, the non-volatile memory data protecting device 200 may contain the power shutdown sensor, thereby preventing a malfunction of the system or a degradation of system performance when a generation or transfer of a signal is delayed even though the power is not shut down.

Figure 3:
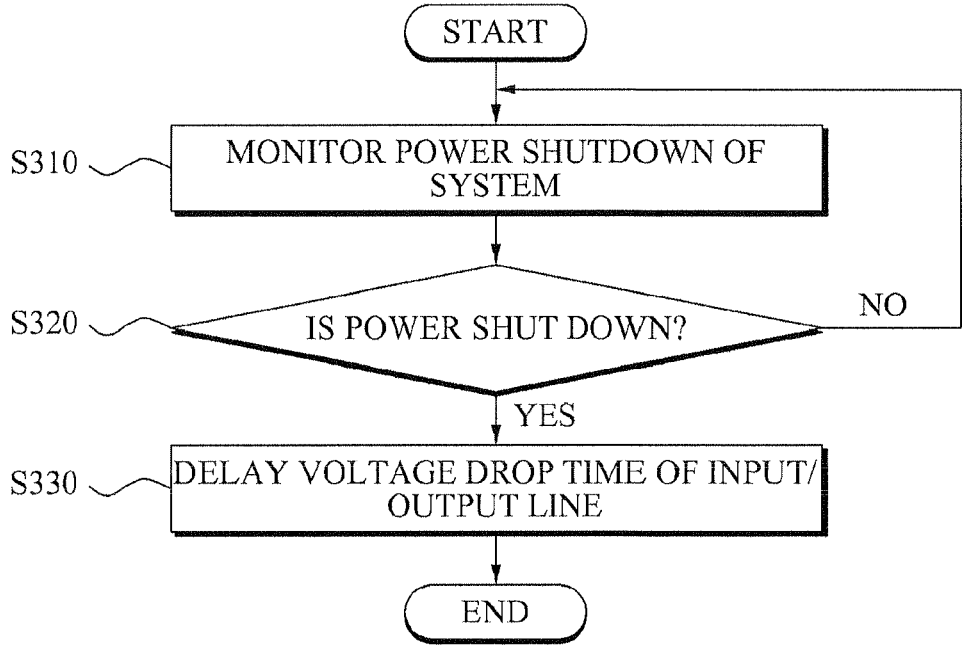
FIG. 3 is a flowchart illustrating a non-volatile memory data protecting method according to an embodiment of the present invention.

FIG. 3 is a flowchart illustrating a non-volatile memory data protecting method according to an embodiment of the present invention.

Referring to FIG. 3, whether a power is shut down in a system is monitored and sensed in operations 5310 through 320. That is, when the power shutdown is monitored, preparation is made to prevent data destruction. In this instance, a digital signal generated when the power is shut down in the system may be used for determining whether the power of the system is shut down. Here, the digital signal may include one of a clock enable (CKE) and a power down exit mode. Also, when the power of the system is shut down, a signal delay circuit is enabled to delay a signal to be generated or transferred, the signal delay circuit being contained for preventing the data destruction.

In operation 5330, when the power is shut down in the system, a time where the signal is transferred to a command line, an address line, and a data line may be delayed by using the delay circuit, the buffer, and the like contained in the system. In this instance, the delayed time may set a time where a voltage supplied to a non-volatile memory module is decreased to be less than or equal to a threshold voltage.

That is, a point in time where voltage of the write enable signal is decreased is delayed to be after a time where the voltage of the non-volatile memory module is decreased to be less than or equal to the threshold voltage. Accordingly, even though the voltage of the write enable signal is 0V and a write enable signal is active, the non-volatile memory module may not operate since the voltage of the non-volatile memory module is already decreased to less than or equal to 0V. Therefore, the non-volatile memory data protecting device may prevent destruction of existing data due to random data that is stored in the non-volatile memory after the power shutdown.

As described above, there may be provided a non-volatile memory data protecting device and method that may use a delay circuit, a buffer, and the like until a voltage of a non-volatile memory module is decreased to be less than or equal to a threshold voltage to delay a signal transfer time, thereby protecting non-volatile memory data from destruction even when a power is shut down.

Also, there may be provided a non-volatile memory data protecting device and method that may control a delay circuit, which delays a drop in voltage, to operate only when the power is shut down, thereby preventing a malfunction of a system and a degradation of system performance.

The non-volatile memory data protecting method according to the above-described example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

According to an embodiment of the present invention, there may be provided a non-volatile memory data protecting device and method that may determine whether a power is shut down in the system, and may delay a drop in voltage of an input/output line, thereby protecting data of the non-volatile memory from destruction even when the power is shut down.

According to an embodiment of the present invention, there may be provided a non-volatile memory data protecting device and method that may control a delay circuit, which delays a drop in voltage, to operate only when a power is shut down in a system, thereby preventing a degradation of system performance and a malfunction of the system.

The invention claimed is:

1. A device for protecting data in a non-volatile memory used in a system, the device comprising:
    a signal delay unit to delay a drop in voltage of an input/output line of the non-volatile memory;
    a power shutdown sensor to sense a power shutdown of the system; and
    a controller to control the signal delay unit in response to the power shutdown sensor sensing the power shutdown of the system.

2. The device of claim 1, wherein the input/output line includes at least one of a data line, an address line, and a command line.

3. The device of claim 1, wherein the signal delay unit is of a type which comprises at least one of a capacitor, a buffer, and a delay circuit to delay a drop in voltage of the input/output line for a predetermined time, and the predetermined time is a period where a voltage supplied to the non-volatile memory is changed to be less than or equal to a threshold voltage.

4. The device of claim 1, wherein the power shutdown sensor senses a power shutdown in response to a clock enable (CKE) signal of the system.

5. The device of claim 1, wherein the power shutdown sensor senses a power shutdown in response to a power down exit mode signal of the system.

6. The device of claim 1, wherein the controller controls the signal delay unit to operate when a power shutdown of the system occurs and prevents the signal delay unit from operation when a power shutdown of the system has not occurred.

7. A method of protecting data in a non-volatile memory, the method comprising:
    sensing power shutdown of a system; and
    delaying a drop in voltage of an input/output line of the non-volatile memory in response to the power shutdown of the system.

8. The method of claim 7, wherein the sensing of the power shutdown of the system senses the power shutdown by using a digital signal that is generated when the power is shut down.

9. The method of claim 8, wherein the digital signal includes at least one of a clock enable (CKE) and a power down exit mode.

10. The method of claim 7, wherein the input/output line includes at least one of a data line, an address line, and a command line to connect a main board with the non-volatile memory.

11. The method of claim 7, wherein the delaying of the drop in voltage comprises:
   delaying the drop in voltage for a predetermined time when the system is shut down by using at least one of a delay circuit, a buffer, and a capacitor; and
   preventing the delaying of the drop in voltage when the system is not shut down.

12. The method of claim 11, wherein the predetermined time is a period where a voltage supplied to the non-volatile memory is changed to be less than or equal to a threshold voltage.

13. A computer readable non-transient recording media storing program instructions which cause a computer processor in a system having a non-volatile memory, a signal delay unit, a power shutdown senor, a controller to control the signal delay unit and at least one computer processor to provide functionality for implementing a method for protecting data in a non-volatile memory according to claim 7.

* * * * *